United States Patent
Nam et al.

(10) Patent No.: US 7,700,455 B2
(45) Date of Patent: Apr. 20, 2010

(54) METHOD FOR FORMING ISOLATION STRUCTURE IN SEMICONDUCTOR DEVICE

(75) Inventors: Ki-Won Nam, Kyoungki-do (KR); Ky-Hyun Han, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 19 days.

(21) Appl. No.: 11/789,354

(22) Filed: Apr. 23, 2007

(65) Prior Publication Data

US 2008/0081434 A1   Apr. 3, 2008

(30) Foreign Application Priority Data

Sep. 29, 2006  (KR) .................. 10-2006-0096521

(51) Int. Cl.
*H01L 21/336* (2006.01)
*H01L 21/76* (2006.01)
(52) U.S. Cl. .............. 438/424; 438/435; 438/761; 438/296
(58) Field of Classification Search ........... 438/435, 438/424
See application file for complete search history.

(56) References Cited

U.S. PATENT DOCUMENTS 6,627,514 B1 * 9/2003 Park et al. .............. 438/435
2005/0118784 A1 * 6/2005 Kim .......................... 438/424

FOREIGN PATENT DOCUMENTS

| KR | 10-2004-0008643 | 1/2004 |
| KR | 10-2005-0110751 | 11/2005 |
| KR | 10-2006-0100714 | 9/2006 |

OTHER PUBLICATIONS

Translattion of Korean patent Application 1020020042311, of record.*

* cited by examiner

*Primary Examiner*—Fernando L Toledo
*Assistant Examiner*—Mamadou Diallo
(74) *Attorney, Agent, or Firm*—Blakely, Sokoloff, Taylor & Zafman LLP

(57) ABSTRACT

A method for forming an isolation structure in a semiconductor device includes preparing a semi-finished substrate including a trench. An oxide layer is formed over sidewalls of the trench. A multiple layer structure of liner layers is formed over the oxide layer. An insulation layer is formed over the multiple layer structure such that the insulation layer fills an inside of the trench. The insulation layer is planarized.

20 Claims, 5 Drawing Sheets

METHOD FOR FORMING ISOLATION STRUCTURE IN SEMICONDUCTOR DEVICE

CROSS-REFERENCE TO RELATED APPLICATIONS

The present invention claims priority of Korean patent application number 10-2006-0096521, filed on Sep. 29, 2006, which is incorporated by reference in its entirety.

BACKGROUND OF THE INVENTION

The present invention relates to a method for fabricating a semiconductor device, and more particularly, to a method for forming an isolation structure in a semiconductor device.

In a typical shallow trench isolation (STI) process, an oxide material usually fills trenches, and is chemically and mechanically polished using a pad nitride layer as a polishing stop layer. The pad nitride layer is removed so as to form field oxide layers (i.e., isolation structures).

FIG. 1 illustrates a conventional isolation structure. A trench 12 is formed in a substrate 11, and an oxide layer 13 is formed on sidewalls of the trench 12. A nitride-based liner layer 14 is formed on the oxide layer 13. An isolation structure 15 is formed on the nitride-based liner layer 14, while filling the inside of the trench 12.

However, edge portions of the isolation structure 15 are overly etched down to a bottom region of adjacent active regions. In other words, moats M are formed around boundary regions between the edge portions of the isolation structure 15 and the active regions. When a gate oxidation process is performed after the formation of the isolation structure 15, due to the moats M, a gate oxide layer 16 has a profile that is almost vertical and becomes thin around the boundary regions. If the gate oxide layer 16 becomes thin, the gate oxide layer 16 is likely to lose its properties even if external sources such as electric shocks are slightly applied.

FIG. 2A is a micrograph illustrating a gate oxide layer whose thickness decreases in a region where a moat is formed. FIG. 2B is a micrograph illustrating a regularly formed gate oxide layer due to the existence of a nitride-based liner layer.

In particular, FIG. 2A illustrates the gate oxide layer whose thickness decreases in the region where the moat is formed because the nitride-based liner layer is partially oxidized during a subsequent process and removed thereafter. In the region where the moat is formed, the gate oxide layer illustrated in FIG. 2A becomes thinner than that illustrated in FIG. 2B. Reference letter 'A' indicates the region where the moat is formed.

The decrease in the thickness of the gate oxide layer in certain regions may result in a limitation in a ramp current stress test (RCST). For instance, reliability of the gate oxide layer may be degraded.

As mentioned above, the nitride-based liner layer is partially oxidized when an oxide material for forming the isolation structure 15 is deposited by a high density plasma process. When the nitride-based liner layer is oxidized, the thickness of the nitride-based liner layer usually changes. During a subsequent cleaning process for removing a pad oxide layer, the oxidized portion of the nitride-based liner layer is overly etched. The over etch of the nitride-based liner layer may induce the formation of moats.

SUMMARY OF THE INVENTION

Specific embodiments of the present invention provide a method for forming an isolation structure in a semiconductor device without damaging a liner layer, which often causes a formation of moats.

In accordance with one aspect of the present invention, there is provided a method for forming an isolation structure in a semiconductor device. The method includes preparing a semi-finished substrate including a trench, forming an oxide layer over sidewalls of the trench, forming a multiple layer structure of liner layers over the oxide layer, forming an insulation layer over the multiple layer structure such that the insulation layer fills an inside of the trench, and planarizing the insulation layer.

In accordance with another aspect of the present invention, there is provided a method for forming an isolation structure in a semiconductor device. The method includes preparing a semi-finished substrate including a trench, forming an oxide layer over sidewalls of the trench, forming a nitride-based liner layer over the oxide layer, oxidizing a portion of the nitride-based liner layer to form an oxynitride layer, forming another oxide layer over the oxynitride layer such that the other oxide layer fills an inside of the trench, and planarizing the other oxide layer.

DESCRIPTION OF SPECIFIC EMBODIMENTS

FIGS. 3A to 3E are cross-sectional views illustrating a method for forming an isolation structure in a semiconductor device in accordance with an embodiment of the present invention.

Figure 1:
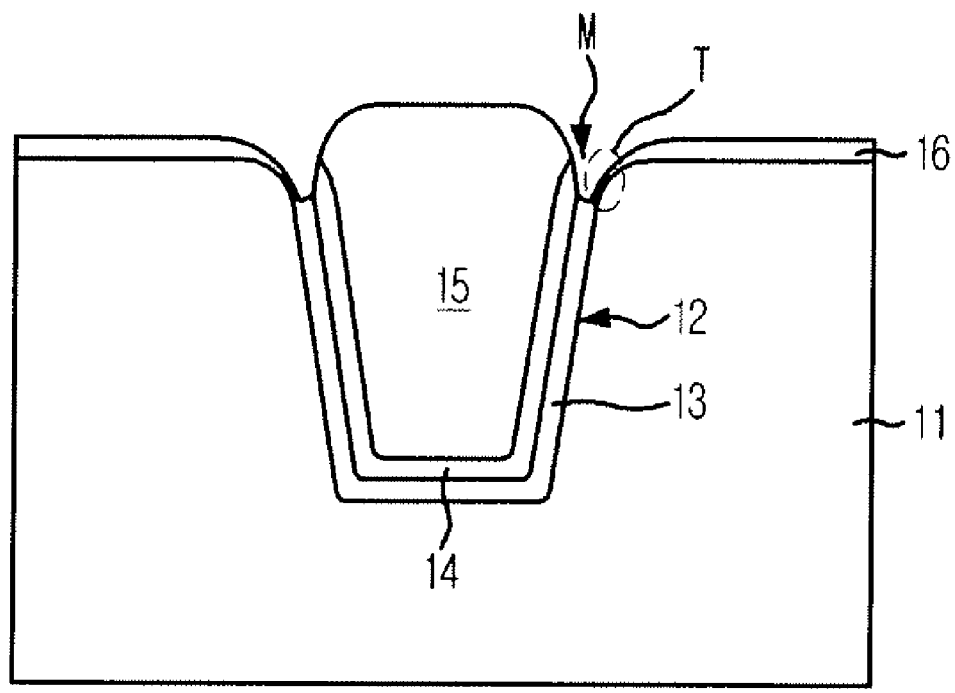
FIG. 1 illustrates a conventional isolation structure.
Figure 2A:
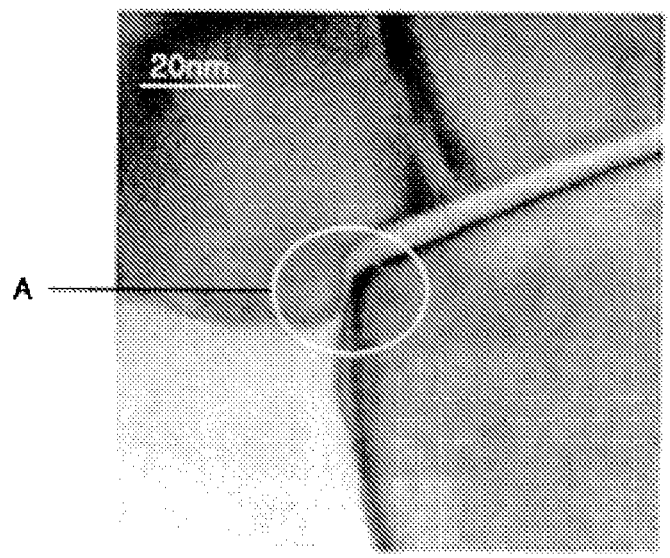
FIG. 2A is a micrograph illustrating a gate oxide layer whose thickness decreases in a region where a moat is formed.
Figure 2B:
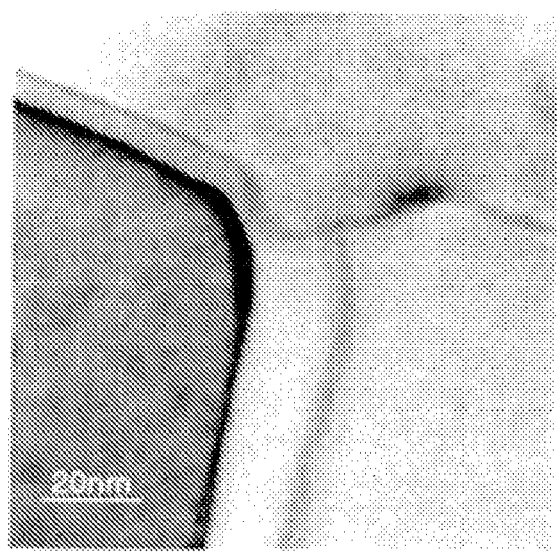
FIG. 2B is a micrograph illustrating a regularly formed gate oxide layer due to the existence of a nitride-based liner layer.
Figure 3A:
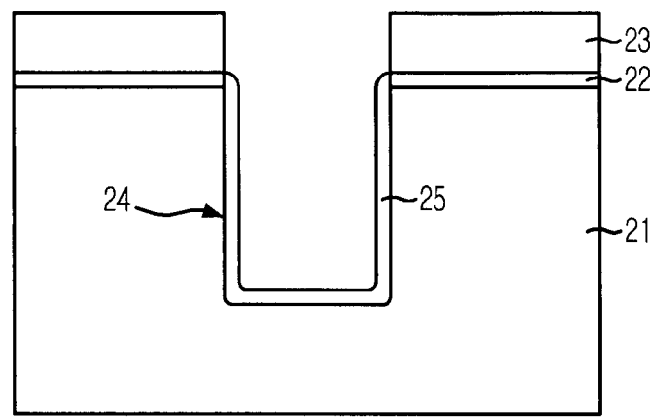
FIGS. 3A to 3E are cross-sectional views illustrating a method for forming an isolation structure in a semiconductor device in accordance with an embodiment of the present invention.

Referring to FIG. 3A, first and second patterned padding layers 22 and 23 are formed over a substrate 21. In detail, first and second padding layers are formed over the substrate 21. The first padding layer is formed of an oxide-based material and is formed to a thickness of about 50 Å to 150 Å by performing a thermal oxidation process. The second padding layer is formed of a nitride-based material and is formed to a thickness of about 1,000 Å to 2,000 Å. The substrate 21 is a silicon-based substrate. A portion of the first and second padding layers where an isolation structure is to be formed in the substrate 21 is etched using photolithography, so as to form the first and second patterned padding layers 22 and 23.

The substrate 21 is etched using the second patterned padding layer 23 as a hard mask to form a trench 24. The etched depth of the substrate ranges from about 1,000 Å to 1,500 Å. The trench 24 is a shallow trench for forming a shallow trench isolation (STI) structure. The etching process for forming the trench 24 may include a dry etching using a plasma. However, the dry etching process may cause a defective silicon lattice and plasma damage on the surface of the trench 24, which may be sources of leakage current.

Figure 3B:
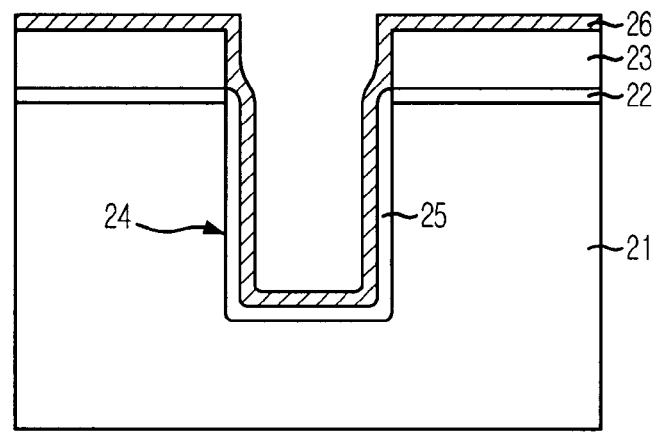

Referring to FIG. 3B, the surface of the trench 24 is oxidized to recover the defective silicon lattice and plasma damage on the surface of the trench 24. Due to this oxidation, an oxide layer 25, more specifically, a silicon oxide ($SiO_2$) layer is formed on the surface of the trench 24. This oxidation process is called "wall oxidation," and the oxide layer 25 is often called "wall oxide layer." The oxide layer 25 is formed to be thin in consideration of a gap-fill margin. For instance, the oxide layer 25 is formed to a thickness of about 80 Å to 100 Å.

A liner layer 26 is formed over the oxide layer 25 and the upper surface of the second patterned padding layer 23. The liner layer 26 includes a nitride-based material, and has a thickness of about 120 Å to 180 Å. The liner layer 26 serves a role in relieving a stress, which may be generated due to a difference in thermal expansion coefficients between the silicon-based substrate 21 and an oxide layer, which will be formed to fill the trench 24 using a high density plasma process. In particular, the liner layer 26 prevents a defect, often generated in an active region, from extending to an isolation structure, so that a refresh characteristic in a cell region can be improved. The liner layer 26 includes silicon nitride ($Si_3N_4$), and is formed by performing a low pressure chemical vapor deposition (LPCVD) method or plasma enhanced chemical vapor deposition (PECVD) method.

Figure 3C:
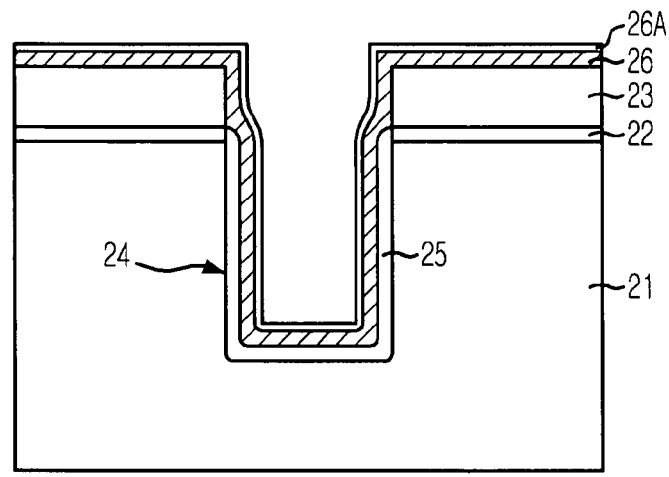

Referring to FIG. 3C, the resultant structure illustrated in FIG. 3B is loaded into a chamber for high density plasma deposition. A $SiO_2$ layer is deposited in the chamber using a high density plasma method. Prior to depositing the $SiO_2$ layer in the chamber, a portion of the liner layer 26 is oxidized to form another liner layer 26A. The other liner layer 26A is an oxide-based layer.

Oxygen and hydrogen gases are used to oxidize the liner layer 26. Due to this oxidation, a portion of the liner layer 26 is transformed into a silicon oxynitride layer having a chemical structure of Si—O—N. More specifically, the silicon oxynitride layer, which is the other liner layer 26A, is formed under conditions of: a chamber pressure ranging from about 0.3 Torr to 1.5 Torr; a substrate temperature ranging from about 400° C. to 700° C.; silane ($SiH_4$), hydrogen ($H_2$), oxygen ($O_2$), and helium (He) gases. Flow rates of the $SiH_4$ and He gases ranges from about 40 sccm to 80 sccm and from about 400 sccm to 500 sccm, respectively. The $O_2$ and $H_2$ gases each have a flow rate of about 40 sccm to 100 sccm.

Before the $SiH_4$ and $O_2$ gases of the plasma, which is generated under the above conditions, react with each other, the $O_2$ gas reacts with nitride from the liner layer 26, so as to form the silicon oxynitride layer (i.e., the other liner layer 26A) having a chemical structure of Si—O—N. The silicon oxynitride layer is formed through a partial oxidation of the liner layer 26.

The $O_2$ gas reacts more rapidly with the liner layer 26 than with the $SiH_4$ gas because of the $H_2$ gas, which causes a reduction reaction with the liner layer 26. This reduction reaction causes the portion of the liner layer 26 (e.g., the surface of the liner layer 26) to be transformed into the silicon oxynitride layer with the Si—O—N chemical structure. The other liner layer 26A (i.e., the silicon oxynitride layer) is formed to a thickness less than about 50 Å. For instance, the other liner layer 26A may have a thickness in a range of about 10 Å to 50 Å. After the reaction, a nitride-based multiple layer structure including the liner layer 26 and the other liner layer 26A is formed.

Figure 3D:
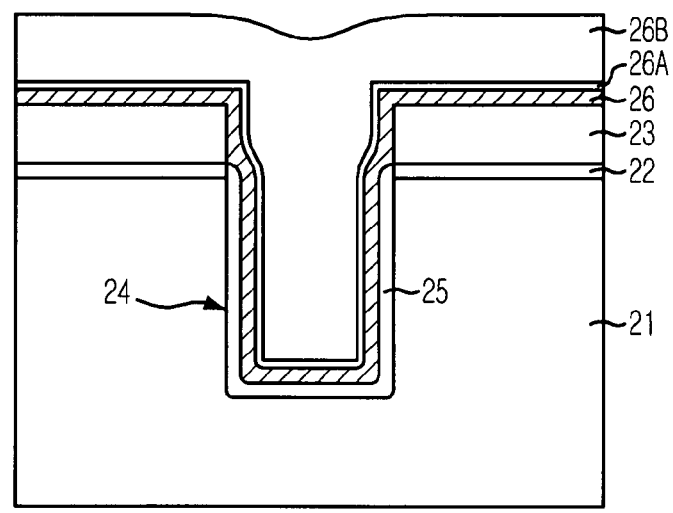

Referring to FIG. 3D, the supply of the $H_2$ gas is stopped. The substrate temperature is decreased to a range of about 100° C. to 400° C., so that the $SiH_4$, $O_2$ and $H_2$ gases react with each other to form a gap-filling layer 26B, which fills the inside of the trench 24. In other words, the gap-filling layer 26B is formed on the other liner layer 26A. The gap-filling layer 26B includes an oxide-based material.

The gap-filling layer 26B is formed at a temperature lower than the temperature at which the other liner layer 26A is formed, because if the gap-filling layer 26B is formed at a temperature greater than about 400° C., instead of the formation of the gap-filling layer 26B, additional oxidation of the liner layer 26 occurs. For this reason, the substrate temperature is reduced to a range of about 100° C. to 400° C. when forming the gap-filling layer 26B. As describe above, the gap-filling layer 26B is formed by supplying $SiH_4$, $O_2$ and He gases into the chamber. The $SiH_4$, $O_2$ and He gases flow at a respective range of about 40 sccm to 80 sccm, about 40 sccm to 100 sccm, and about 400 sccm to 500 sccm.

As described above, when the gap-filling layer 26B is formed by the high density plasma method, the portion of the liner layer 26 (e.g., the surface of the liner layer 26) is oxidized in situ prior to forming the gap-filling layer 26B. As a result of the precedent oxidation, the other liner nitride layer 26A, which is a silicon oxynitride layer, is formed. The other liner layer 26A and the gap-filling layer 26B are formed in situ in the same chamber for high density plasma deposition.

Figure 3E:
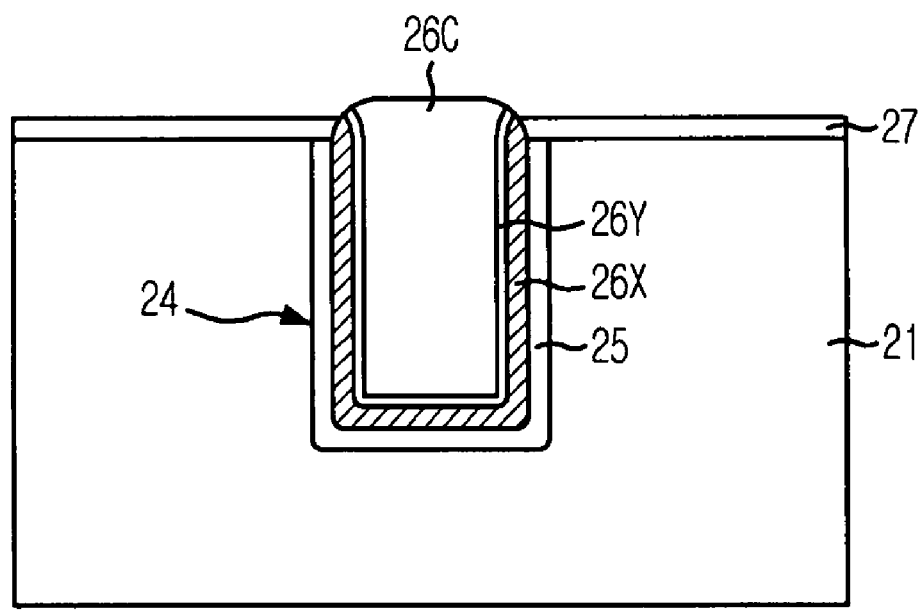

Referring to FIG. 3E, a chemical mechanical polishing (CMP) is performed such that an isolation structure 26C fills the inside of the trench 24. The second and first patterned padding layer 23 and 22 are removed. During the removal of the first patterned padding layer 22, the other liner layer 26A (see FIG. 3D) is etched more slowly than the first patterned padding layer 22. Thus, the other liner layer 26A is not likely to be over-etched (i.e., less damage to the other liner layer 26A). Since the other liner layer 26A is not damaged while removing the first patterned padding layer 22, the thickness of the liner layer 26 does not change, thereby preventing generation of moats. Reference numerals 26X and 26Y respectively denote remaining liner layer and the other remaining liner layer after the CMP and the removal of the first and second patterned padding layers 22 and 23.

A gate insulation layer 27 is formed over certain regions of the substrate 21. The gate insulation layer 27 includes an oxide-based material. Since the moats are not generated, the thickness of the gate insulation layer 27 does not decrease.

On the basis of the embodiment of the present invention, a portion of the liner layer is oxidized to the silicon oxynitride layer having a Si—O—N chemical structure, which functions as a buffer layer. Due to the silicon oxynitride layer (i.e., the other liner layer), the liner layer can relieve stress on silicon (i.e., the substrate), and simultaneously, damage to the liner layer is not incurred during subsequent processes. The protection of the liner layer also disallows thinning of the gate insulation layer around regions where moats are generally formed. This effect further contributes to an improvement on reliability of the gate insulation layer.

While the present invention has been described with respect to various embodiments, it will be apparent to those skilled in the art that various changes and modifications may be made without departing from the spirit and scope of the invention as defined in the following claims.

What is claimed is:

1. A method of forming an isolation structure in a semiconductor device, the method comprising: preparing a semifinished substrate including a trench; forming pad patterns over the substrate while exposing the trench; forming an oxide layer over an inside of the trench; forming a multiple layer structure of liner layers over the oxide layer and over the pad patterns; forming an insulation layer over the multiple layer structure such that the insulation layer fills the inside of the trench; and planarizing the insulation layer until the substrate is exposed, wherein forming the multiple layer structure of the liner layers comprises: forming a nitride layer over the oxide layer and the pad patterns; and oxidizing a portion of a thickness of the nitride layer that is less than an entire thickness of the nitride layer from a top surface of the nitride layer to form an oxynitride layer on the nitride layer, wherein the insulation layer is formed under a temperature lower than that of forming the oxynitride layer.

2. The method of claim 1, wherein the nitride layer includes silicon nitrirde ($Si_3N_4$), and the oxynitride layer includes silicon oxynitride (SiON).

3. The method of claim 2, wherein the silicon oxynitride layer is formed by oxidizing the silicon nitride layer through supplying silane ($SiH_4$) gas, oxygen ($O_2$) gas, hydrogen ($H_2$) gas, and helium (He) gas in a chamber for high density plasma deposition.

4. The method of claim 3, wherein forming the silicon oxynitride layer is performed under conditions of: a chamber pressure ranging from about 0.3 Torr to 1.5 Torr; and a temperature ranging from about 400° C. to 700° C.

5. The method of claim 2, wherein forming the silicon nitride layer comprises performing one of a low pressure chemical vapor deposition (LPCVD) method and a plasma enhanced chemical vapor deposition (PECVD) method.

6. The method of claim 2, wherein the silicon nitride layer is formed to a thickness in a range of about 120 Å to 180 Å.

7. The method of claim 2, wherein the silicon oxynitride layer is formed to a thickness in a range of about 10 Å to 50 Å.

8. The method of claim 1, wherein forming the insulation layer comprises forming a silicon oxide layer in a chamber for high density plasma deposition.

9. The method of claim 8, wherein forming the silicon oxide layer comprises supplying silane ($SiH_4$) gas, oxygen ($O_2$) gas, and helium (He) gas in the chamber for the high density plasma deposition.

10. The method of claim 9, wherein forming the silicon oxide layer is performed under conditions of: a chamber pressure ranging from about 0.3 Torr to 1.5 Torr; and a temperature ranging from about 100° C. to 400° C.

11. The method of claim 1, wherein oxidizing a portion of a thickness of the nitride-based liner layer from the top surface of the nitride layer comprises oxidizing an entire surface of the nitride layer including at a bottom of the trench.

12. A method of forming an isolation structure in a semiconductor device, the method comprising: preparing a semi-finished substrate including a trench; forming pad patterns over the substrate while exposing the trench; forming a first oxide layer over an inside of the trench; forming a nitride-based liner layer over the first oxide layer and the pad patterns; oxidizing a portion of a thickness of the nitride-based liner layer that is less than an entire thickness of the nitride-based liner layer from a top surface of the nitride-based liner layer to form an oxynitride layer on the nitride-based liner layer; forming a second oxide layer over the oxynitride layer under a temperature lower than that of forming the oxynitride layer such that the second oxide layer fills the trench; and planarizing the second oxide layer until the substrate is exposed.

13. The method of claim 12, wherein forming the oxynitride layer and forming the second oxide layer proceed in situ in a chamber for high density plasma deposition.

14. The method of claim 13, wherein forming the oxynitride layer comprises forming a silicon oxynitride layer by supplying silane ($SiH_4$) gas, oxygen ($O_2$) gas, hydrogen ($H_2$) gas, and helium (He) gas, and forming the second oxide layer comprises forming a silicon oxide layer by supplying the $SiH_4$ gas, the $O_2$ gas, and the He gas.

15. The method of claim 14, wherein forming the silicon oxynitride layer comprises supplying the $SiH_4$ gas at a flow rate ranging from about 40 sccm to 80 sccm, the He gas at a flow rate ranging from about 400 sccm to 500 sccm, and the $O_2$ and $H_2$ gases each at a flow rate ranging from about 40 sccm to 100 sccm.

16. The method of claim 14, wherein forming the silicon oxide layer comprises supplying the $SiH_4$ gas at a flow rate ranging from about 40 sccm to 80 sccm, the He gas at a flow rate ranging from about 400 sccm to 500 sccm, and the $O_2$ gas at a flow rate ranging from about 40 sccm to 100 sccm.

17. The method of claim 14, wherein forming the silicon oxynitride layer and forming the silicon oxide layer each proceed under conditions of a chamber pressure ranging from about 0.3 Torr to 1.5 Torr; and a temperature ranging from about 400 ° C. to 700° C.

18. The method of claim 12, wherein forming the nitride-based liner layer comprises performing one of a low pressure chemical vapor deposition (LPCVD) method and a plasma enhanced chemical vapor deposition (PECVD) method.

19. The method of claim 12, wherein the nitride-based liner layer is formed to a thickness in a range of about 120 Å to 180 Å.

20. The method of claim 12, wherein the oxynitride layer is formed to a thickness of about 10 Å to 50 Å.

* * * * *